United States Patent
Wu et al.

(10) Patent No.: US 7,885,072 B2
(45) Date of Patent: Feb. 8, 2011

(54) FIXING DEVICE FOR HEAT SINK

(75) Inventors: Wei-Le Wu, Shenzhen (CN); Jin-Song Feng, Shenzhen (CN); Cheng-Tien Lai, Taipei Hsien (TW)

(73) Assignees: Fu Zhun Precision Industry (Shen Zhen) Co., Ltd., Shenzhen, Guangdong Province (CN); Foxconn Technology Co., Ltd., Tucheng, Taipei County (TW)

( * ) Notice: Subject to any disclaimer, the term of this patent is extended or adjusted under 35 U.S.C. 154(b) by 39 days.

(21) Appl. No.: 12/417,605

(22) Filed: Apr. 2, 2009

(65) Prior Publication Data

US 2010/0097766 A1    Apr. 22, 2010

(30) Foreign Application Priority Data

Oct. 20, 2008    (CN) .................... 2008 1 0305006

(51) Int. Cl.
*H05K 7/20* (2006.01)

(52) U.S. Cl. .................. 361/700; 361/697; 361/719; 165/80.3; 165/185; 165/104.33

(58) Field of Classification Search ............. 257/719
See application file for complete search history.

(56) References Cited

U.S. PATENT DOCUMENTS

| 7,239,518 | B2 * | 7/2007 | Yang et al. .................. 361/704 |
| 7,283,368 | B2 * | 10/2007 | Wung et al. ................ 361/719 |
| 7,345,880 | B2 * | 3/2008 | Lo .............................. 361/704 |
| 7,430,122 | B2 * | 9/2008 | Li .............................. 361/719 |
| 7,609,522 | B2 * | 10/2009 | Jin et al. ..................... 361/710 |
| 2003/0159819 | A1 * | 8/2003 | Lee ............................ 165/185 |
| 2006/0120053 | A1 * | 6/2006 | Lee et al. .................... 361/704 |
| 2008/0123295 | A1 * | 5/2008 | Wu et al. ..................... 361/697 |
| 2009/0050308 | A1 * | 2/2009 | Kuo ............................ 165/185 |

* cited by examiner

*Primary Examiner*—Gregory D Thompson
(74) *Attorney, Agent, or Firm*—Frank R. Niranjan

(57) ABSTRACT

A fixing device fastens a heat sink having a base on one of motherboards with different specifications. Each motherboard with a corresponding specification defines a plurality of extending holes therethrough. The fixing device comprises a plurality of slats each having an end thereof pivotally connecting to the base of the heat sink and the other end thereof defining an elongated slot for corresponding to one of the extending holes of the one of the motherboards, a back plate defining a plurality of mounting holes corresponding to the extending holes of the motherboards, and a plurality of fixing units extending through the slots of the slats, the extending holes of the one of the motherboards and corresponding mounting holes of the back plate to mount the heat sink on the one of the motherboards.

14 Claims, 4 Drawing Sheets

FIXING DEVICE FOR HEAT SINK

BACKGROUND

1. Technical Field

The present disclosure relates to a fixing device and, more particularly, to a fixing device for fixing a heat sink on motherboards with different specifications.

2. Description of Related Art

With an increasing development of computer, there are many specifications for motherboards, such as AMD K8 specification, AM2 specification, Intel LGA775 specification, and LGA1366 specification.

Electronic devices such as central processing units (CPUs), which are mounted on the motherboard, frequently generate large amounts of heat. The heat must be quickly removed from the electronic device to prevent it from becoming unstable or being damaged. Typically, a heat sink is attached to an outer surface of the electronic device via a fixing device to absorb heat generated by the electronic device.

However, the fixing device can only fix the heat sink on one specification of motherboard, which means that different fixing devices having different configurations are required for fixing the heat sinks to the CPUs mounted on AMD K8 motherboard, AM2 motherboard, Intel LGA775 motherboard, and LGA1366 motherboard. To manufacture such different fixing devices and manage the inventory thereof are costly.

What is needed, therefore, is a fixing device which is compatible with motherboards with different specifications.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Figure 1:
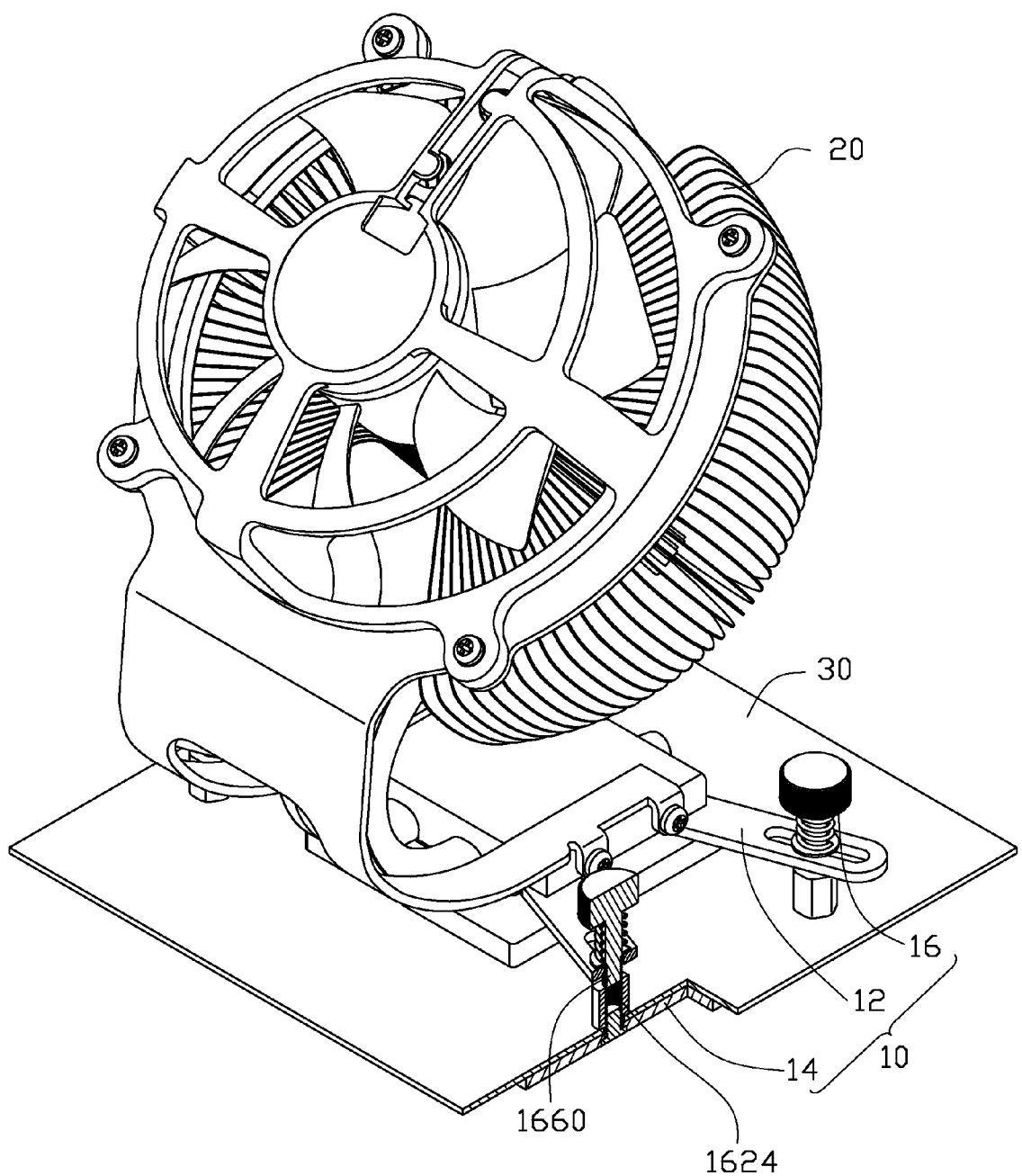
FIG. 1 is an assembled and partially cut-away view of a fixing device in accordance with an embodiment of the present disclosure, wherein the fixing device fixes a heat sink on a motherboard.

Referring to FIG. 1, a fixing device 10 is illustrated in accordance with an embodiment of the present disclosure. The fixing device 10 fixes a heat sink 20 on a motherboard 30, to dissipate heat generated by an electronic device 40 on the motherboard 30. The fixing device 10 comprises a plurality of slats 12 at an upper side of the motherboard 30, a back plate 14 at a lower side of the motherboard 30 and a plurality of fixing units 16 extending through the motherboard 30 and interconnecting these slats 12 and the back plate 14.

Figure 2:
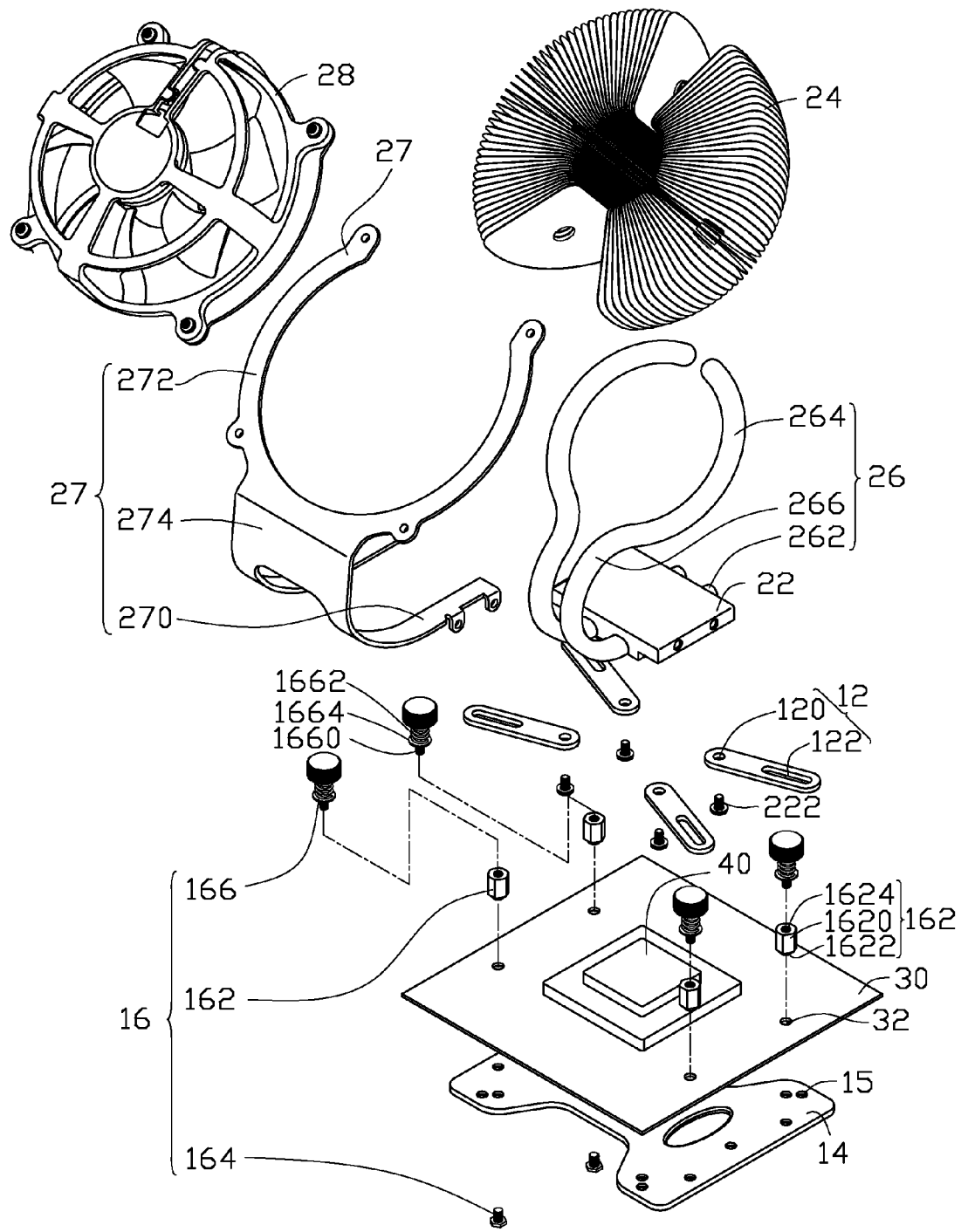
FIG. 2 is an exploded view of FIG. 1.

Referring to FIG. 2 also, the heat sink 20 comprises a base 22 for contacting with the electronic device 40, a plurality of fins 24 located above the base 22, two heat pipes 26 connecting the base 22 and the fins 24, a fan 28 positioned over an upper-front face of the fins 24, and a fan holder 27 secured on the base 22 for protecting the heat pipes 26 and supporting the fan 28.

Each heat pipe 26 comprises a straight evaporation section 262, an arc-shaped condensation section 264 located above the base 22 and a connecting section 266 interconnecting the condensation section 264 and the evaporation section 262. The straight evaporation sections 262 of the heat pipes 26 are parallel to each other and received in a central portion of the base 22. The condensation sections 264 are coplanar with each other and slantwise to the base 22. The condensation sections 264 each have an approximately semicircular configuration and extends upwardly and slantwise from a corresponding connecting section 266. The condensation sections 264 cooperatively define a circle. The fins 24 are grouped in two fan-shaped portions through each of which a corresponding condensation section 264 of one of the two heat pipes 26 extends, whereby heat in the corresponding condensation section 264 can be dissipated by the fins 24. On the condensation sections 264 of the two heat pipes 26, the fins 24 has inner ends converged together, and outer ends splayed and dispersed. A substantially round opening (not labeled) is surrounded by the inner ends of the fins 24 and in communication with a space between the two condensation sections 264. The fan holder 27 comprises two parallel securing arms 270 parallel to the evaporation sections 262 of the heat pipes 26, two coplanar mounting arms 272 slantwise to the securing arms 270 and a connecting portion 274 connecting the securing arms 270 and the mounting arms 272. The securing arms 270 are secured to two opposite sides of the base 22. The mounting arms 272 are parallel to the condensation sections 264 of the heat pipes 26 and disposed above the fins 24, forming cooperatively a ring having a cut defined at an upper portion thereof. The fan 28 is mounted on the mounting arms 272 for blowing a forced airflow toward the fins 24 to improve the heat dissipation efficiency of the heat sink 20 by forced heat convection. Simultaneously, the forced airflow is brought toward other electronic devices around the heat sink 20 to dissipate heat generated by other electronic devices. In this embodiment, the opening surrounded by the inner ends of the fins 24 confronts a hub of the fan 28. Thus, every parts of the fins 24 can be subject to a substantial airflow generated by the fan 28.

Figure 4:
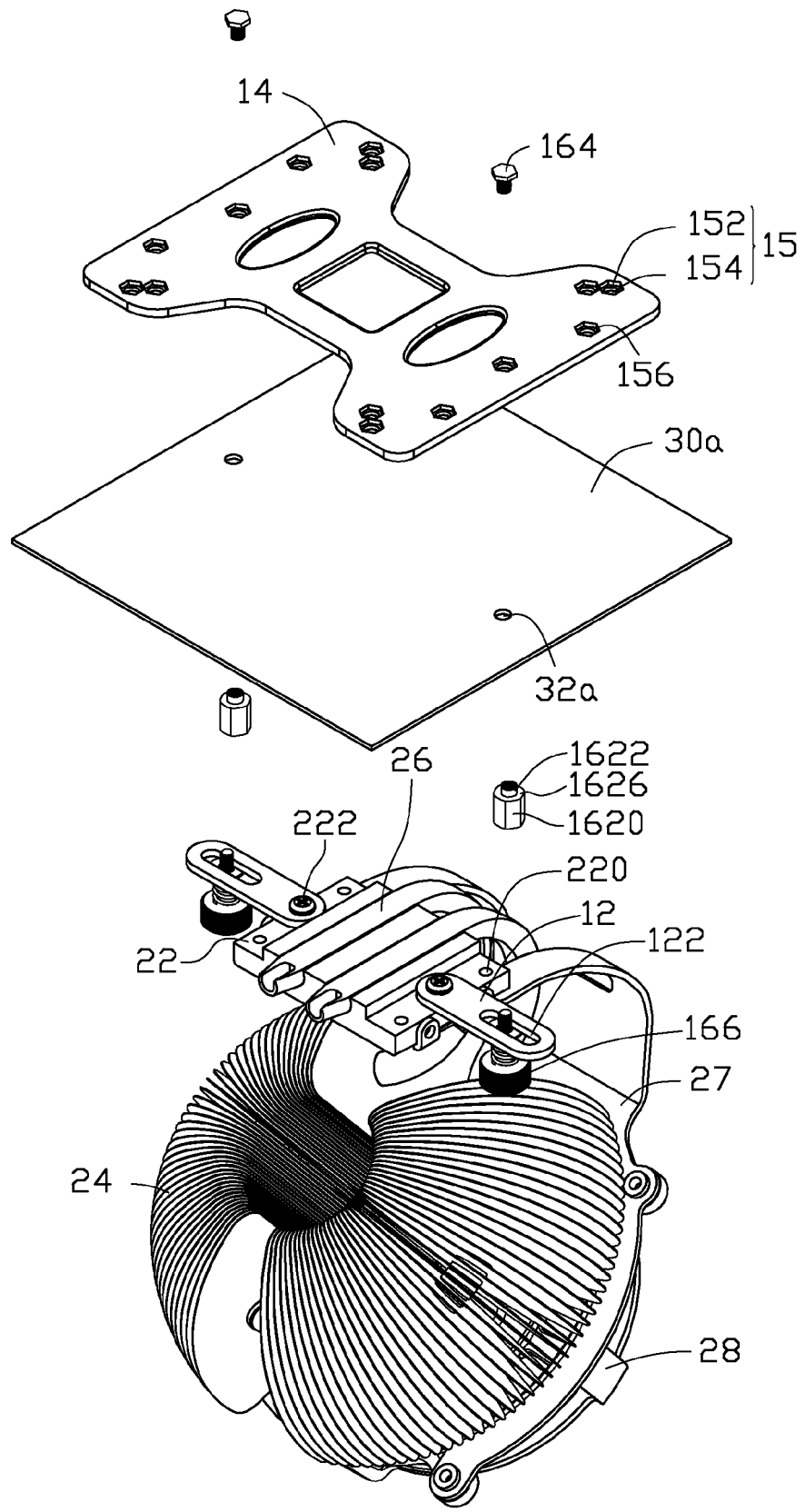
FIG. 4 is similar to FIG. 3, but the fixing device fixes the heat sink on another motherboard.

The motherboard 30 defines a plurality of extending holes 32 around the electronic device 40. A specification for the motherboard 30 can be AMD K8, AM2, Intel LGA775, or LGA1366. In this embodiment, the motherboard 30 is AM2 and defines four extending holes 32 around the electronic device 40. In other uses, the motherboard 30a can be AMD K8 (see FIG. 4), and defines two extending holes 32a therein.

Figure 3:
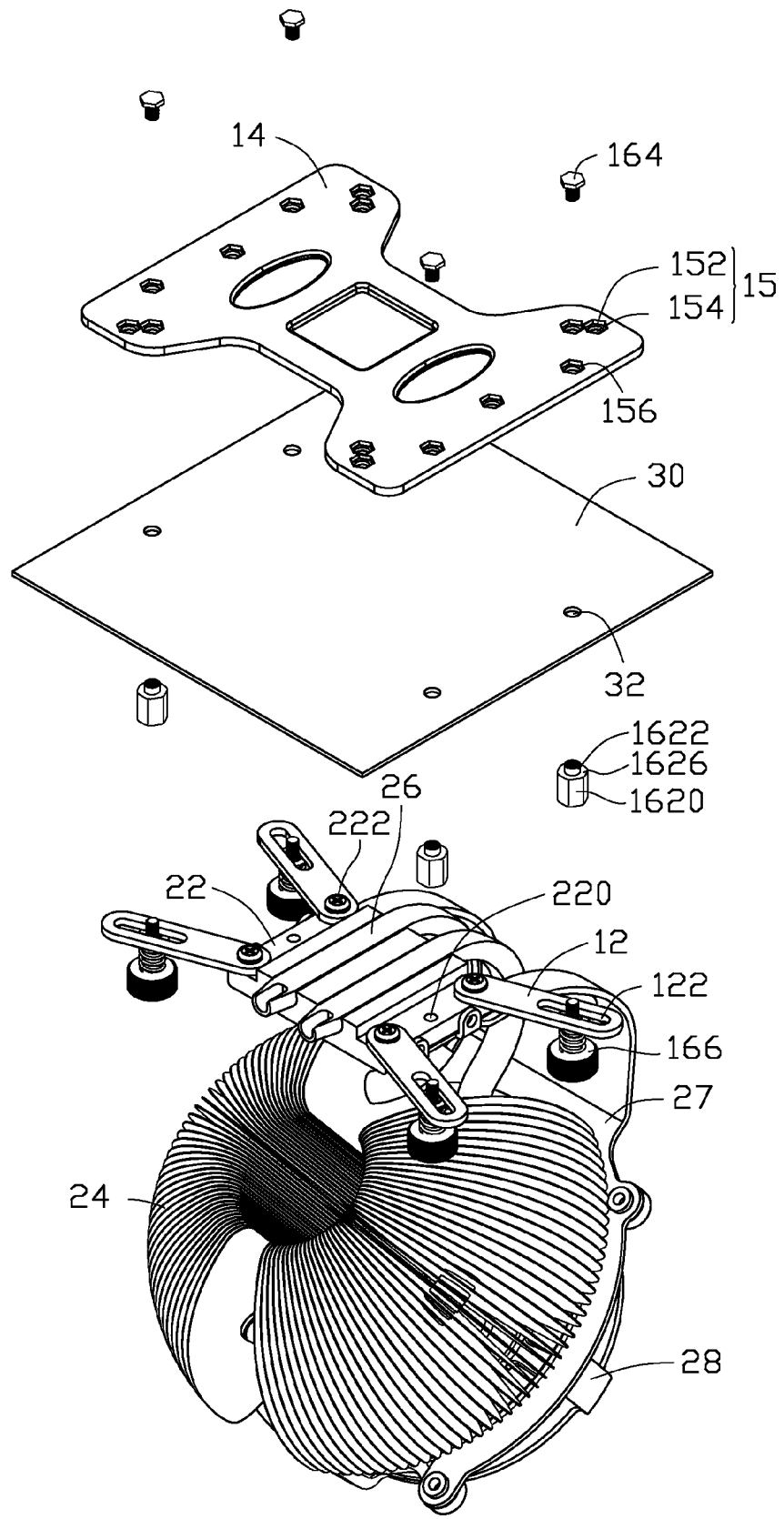
FIG. 3 is a partially exploded and inverted view of FIG. 1.

Also referring to FIG. 3, the base 22 defines a plurality of assembling holes 220 at two opposite sides of a bottom portion thereof. Each slat 12 defines a pivot hole 120 at an end thereof for aligning with a corresponding assembling hole 220 of the base 22. A plurality of screws 222 extends through the pivot holes 120 of the slats 12 and engages into the assembling holes 220 of the base 22 to fasten the slats 12 on the base 22. The other end of each slat 12 defines an elongated slot 122 therein for receiving a corresponding fixing unit 16. The other ends of the slats 12 extend beyond the base 22 of the heat sink 20. The fixing units 16 engage in the slots 122 of the slats 12 respectively and are slideable along the slots 122. When the screw 222 is not locked tightly, the slat 12 rotates around the screw 222 to make the slot 122 of the slat 12 align with the extending hole 32 (32a, FIG. 4) defined in the motherboard 30 (30a, FIG. 4). The fixing units 16 slide along the slots 122 of the slats 12 to engaging in the extending holes 32 (32a, FIG. 4).

The back plate 14 is a dumbbell-shaped board. The back plate 14 is symmetrical about intercrossed central lines (not shown) thereof, which longitudinally and transversely extend through a center of the back plate 14. A plurality of mounting holes 15 is defined at two opposite ends of the back plate 14. The mounting holes 15 are aligned with the extending holes 32, 32*a* of the motherboards 30, 30*a*, when the back plate 14 is positioned under the motherboard 30 (30*a*) in order to mount the heat sink 20 on the motherboard 30 (30*a*).

Each mounting hole 15 is a counterbore and comprises a first receiving hole 152 and a second receiving hole 154 located under and in communication with a lower portion of the first receiving hole 152. The first receiving hole 152 is hexagonal. The second receiving hole 154 is round. A diameter of the first receiving hole 152 is larger than that of the second receiving hole 154. A baffling portion 156 is located between the first and second receiving holes 152, 154 of the mounting hole 15.

Referring to FIG. 2 again, each fixing unit 16 comprises a bushing 162, a screw 164 engaging with a bottom of the bushing 162 for mounting the bushing 162 on the motherboards 30 and a fastener 166 engaging with a top of the bushing 162. The fastener 166 comprises a bolt 1660 having a shaft with threads machined on an exterior thereof. A helical spring 1662 and a gasket 1664 are sequentially coiled around the shaft of the bolt 1660. Referring to FIG. 3 also, the bushing 162 has a substantially column-shaped configuration. The bushing 162 comprises a grasping portion 1620 with a hexagonal cross section and a column-shaped inserting portion 1622. Diameter of the inserting portion 1622 is smaller than that of the grasping portion 1620. A resisting portion 1626 is located between the grasping portion 1620 and the inserting portion 1622. A threaded hole 1624 is defined in a center of the bushing 162.

Also referring to FIG. 1, in assembly, the inserting portion 1622 extends downwards through the extending hole 32 of the motherboard 30 and inserts into a corresponding mounting hole 15 of the back plate 14. At the same time, the screw 164 extends upwardly through the corresponding mounting hole 15 and screws into the threaded hole 1624 of the bushing 162. The resisting portion 1626 abuts tightly against a top surface of the motherboard 30. The shaft of the bolt 1660 of the fastener 166 extends downwards through the slot 122 of the slat 12 and screws into the threaded hole 1624 of the bushing 162. The gasket 1664 abuts tightly against a top face of the slat 12 beside the slot 122. So that the fixing units 16 secure the slats 12, the motherboard 30 and the back plate 14 together, thereby fastening the heat sink 20 on the motherboard 30 and causing the heat sink 20 to have an intimate contact with the electronic device 40.

The mounting holes 15 corresponding to different extending holes 32 of different motherboards 30, 30*a* with different specifications are defined in a single back plate 14 to facilitate mass manufacture and inventory management. When the pivot holes 120 of the slats 12 are connected to the assembling holes 220 of the base 22, a position of each slat 12 mounted on the base 22 of the heat sink 20 can be adjusted by rotating about a corresponding pivot hole 120. Thus, the slots 122 of the slats 12 can be moved to align with different extending holes 32 of the motherboards 30, 30*a* of different specifications. Thus, the fixing device 10 is compatible with the motherboards 30, 30*a* with different specifications and can mount the heat sink 20 on the different motherboards 30, 30*a*.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A fixing device fastening a heat sink having a base which defines a plurality of assembling holes at two opposite sides of a bottom portion of the base to one of motherboards with different specifications each of which defines a plurality of extending holes therethrough, the fixing device comprising:
   a plurality of slats each having an end thereof pivotally connecting to the base of the heat sink, another end of each slat defining an elongated slot corresponding to one of the extending holes of the one of the motherboards;
   a back plate defining a plurality of mounting holes corresponding to the extending holes of the one of the motherboards, in which at least some of the mounting holes of the back plate align with the extending holes of the one of the motherboards, each mounting hole of the back plate being a counterbore and comprising a first receiving hole and a second receiving hole located under and in communication with a lower portion of the first receiving hole, a diameter of the first receiving hole of the mounting hole of the back plate being larger than that of the second receiving hole to form a baffling portion between the first receiving hole and the second receiving hole, the first receiving hole being hexagonal; and
   a plurality of fixing units secured on the one of the motherboards;
   wherein the fixing units each extend through the elongated slot of a corresponding slat, a corresponding extending hole of the one of the motherboards and a corresponding mounting hole of the back plate to secure the heat sink, the slats, the one of the motherboards and the back plate together; and
   wherein each of the fixing units comprises a bushing, a screw engaging with a bottom of the bushing and a fastener engaging with a top of the bushing, the bushing defining a threaded hole in a center thereof and comprising a grasping portion and an inserting portion extending downwardly from the grasping portion, the inserting portion extending downwards through a corresponding extending hole of the one of the motherboards and engaging with the screw.

2. The fixing device as claimed in claim 1, wherein the fastener of each of the fixing units comprises a bolt having a shaft, and the shaft extends through a corresponding slot and engages with the grasping portion of the bushing of the fixing unit.

3. A heat sink assembly comprising;
   a base secured on one of motherboards with different specifications each of which defines a plurality of extending holes;
   a plurality of slats each having an end thereof pivotally connecting to the base, and another end thereof defining a slot corresponding to one of the extending holes of the one of the motherboards;
   a plurality of fixing units extending through the slots of the slats, respectively, and being slidable horizontally along the slots corresponding to the extending holes of the one of the motherboards; and
   a plurality of fins located above the base;
   wherein the fins have inner ends converged, and outer ends splayed, an opening being surrounded by the inner ends.

4. The heat sink assembly as claimed in claim 3, further comprising two heat pipes connecting the base and the fins.

5. The heat sink assembly as claimed in claim 3, wherein each heat pipe comprises a straight evaporation section received in a central portion of the base and an arc-shaped condensation section located above the evaporation section.

6. The heat sink assembly as claimed in claim 5, wherein the evaporation sections of the two heat pipes are parallel to each other.

7. The heat sink assembly as claimed in claim 6, wherein the condensation sections of the heat pipes are coplanar with each other and slantwise to the base.

8. The heat sink assembly as claimed in claim 7, wherein the condensation sections of the heat pipes each have a semi-circular configuration and are located in a same circle.

9. The heat sink assembly as claimed in claim 8, wherein the fins are grouped in two fan-shaped units through each of which the condensation section of a corresponding one of the heat pipes extends.

10. The heat sink assembly as claimed in claim 9, further comprising a fan located above the fins via a fan holder secured on the base, wherein the fan holder comprises two securing arms each parallel to the evaporation sections of the heat pipes, two mounting arms slantwise to the securing arms, and a connecting portion interconnecting the securing arms and the mounting arms, the fan being secured on the mounting arms.

11. The heat sink assembly as claimed in claim 10, wherein the securing arms are secured to two opposite sides of the base.

12. The fixing device as claimed in claim 11, wherein the mounting arms are coplanar and parallel to the condensation sections of the heat pipes, and disposed above the fins, cooperatively forming a ring having a cut defined at an upper portion thereof.

13. A fixing device configured for fastening a heat sink having a base to one of motherboards with different specifications each of which defines a plurality of extending holes therethrough, the fixing device comprising:

a plurality of slats each having an end configured for pivotally connecting to the base of the heat sink, another end defining an elongated slot corresponding to one of the extending holes of the one of the motherboards;

a back plate defining a plurality of mounting holes corresponding to the extending holes of the one of the motherboards, in which at least some of the mounting holes of the back plate align with the extending holes of the one of the motherboards; and a plurality of fixing units configured for being secured on the one of the motherboards, each of the fixing units comprising a bushing, a screw engaging with a bottom of the bushing and a fastener engaging with a top of the bushing, the bushing defining a threaded hole in a center thereof and comprising a grasping portion and an inserting portion extending downwardly from the grasping portion;

wherein the inserting portion of each of the fixing units is configured for extending through the elongated slot of a corresponding slat, a corresponding extending hole of the one of the motherboards and a corresponding mounting hole of the back plate to engage with the screw, to thereby secure the heat sink, the slats, the one of the motherboards and the back plate together.

14. The fixing device as claimed in claim 13, wherein the fastener of each of the fixing units comprises a bolt having a shaft, and the shaft extends through a corresponding slot and engages with the grasping portion of the bushing of the fixing unit.

* * * * *